(12) United States Patent
Choi et al.

(10) Patent No.: US 9,947,554 B2
(45) Date of Patent: Apr. 17, 2018

(54) SUPPORT SUBSTRATE AND A METHOD OF MANUFACTURING A SEMICONDUCTOR PACKAGE USING THE SAME

(71) Applicant: Samsung Electronics Co., Ltd., Suwon-si, Gyeonggi-do (KR)

(72) Inventors: Yoonseok Choi, Siheung-si (KR); Ilho Kim, Seoul (KR); Changho Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/345,534

(22) Filed: Nov. 8, 2016

(65) Prior Publication Data

US 2017/0243763 A1 Aug. 24, 2017

(30) Foreign Application Priority Data

Feb. 19, 2016 (KR) .................. 10-2016-0019771

(51) Int. Cl.
*H01L 21/56* (2006.01)
*H01L 21/683* (2006.01)
*H01L 23/00* (2006.01)
*H01L 23/373* (2006.01)
*H01L 23/31* (2006.01)

(52) U.S. Cl.
CPC ........ *H01L 21/568* (2013.01); *H01L 21/6835* (2013.01); *H01L 24/96* (2013.01); *H01L 21/561* (2013.01); *H01L 23/3128* (2013.01); *H01L 23/373* (2013.01); *H01L 2221/68318* (2013.01); *H01L 2221/68386* (2013.01); *H01L 2224/02331* (2013.01); *H01L 2224/13024* (2013.01)

(58) Field of Classification Search
CPC .... H01L 21/568; H01L 21/6835; H01L 24/96
See application file for complete search history.

(56) References Cited

U.S. PATENT DOCUMENTS

| 7,192,805 | B2 | 3/2007 | Jobetto | |
|---|---|---|---|---|
| 8,710,683 | B2 | 4/2014 | Kim | |
| 2003/0011108 | A1 | 1/2003 | Matthies | |
| 2009/0179317 | A1* | 7/2009 | Iida | B81C 1/00238 257/685 |
| 2010/0201462 | A1* | 8/2010 | Blair | H01P 3/006 333/238 |
| 2014/0329083 | A1 | 11/2014 | Kim et al. | |
| 2016/0104620 | A1* | 4/2016 | Kurokawa | H01L 21/76251 438/457 |

FOREIGN PATENT DOCUMENTS

| JP | 2009-177034 A | 8/2009 |
|---|---|---|
| KR | 10-2009-0002887 A | 1/2009 |
| KR | 10-1393700 B1 | 5/2014 |
| KR | 10-1393701 B1 | 5/2014 |
| KR | 10-2014-0123695 A | 10/2014 |

\* cited by examiner

*Primary Examiner* — Long Pham
(74) *Attorney, Agent, or Firm* — Lee & Morse, P.C.

(57) ABSTRACT

A support substrate, a method of manufacturing a semiconductor package, and a semiconductor package, the support substrate including a first plate; a second plate on the first plate; and an adhesive layer between the first plate and the second plate, wherein a coefficient of thermal expansion (CTE) of the adhesive layer is higher than a CTE of the first plate and higher than a CTE of the second plate.

19 Claims, 14 Drawing Sheets

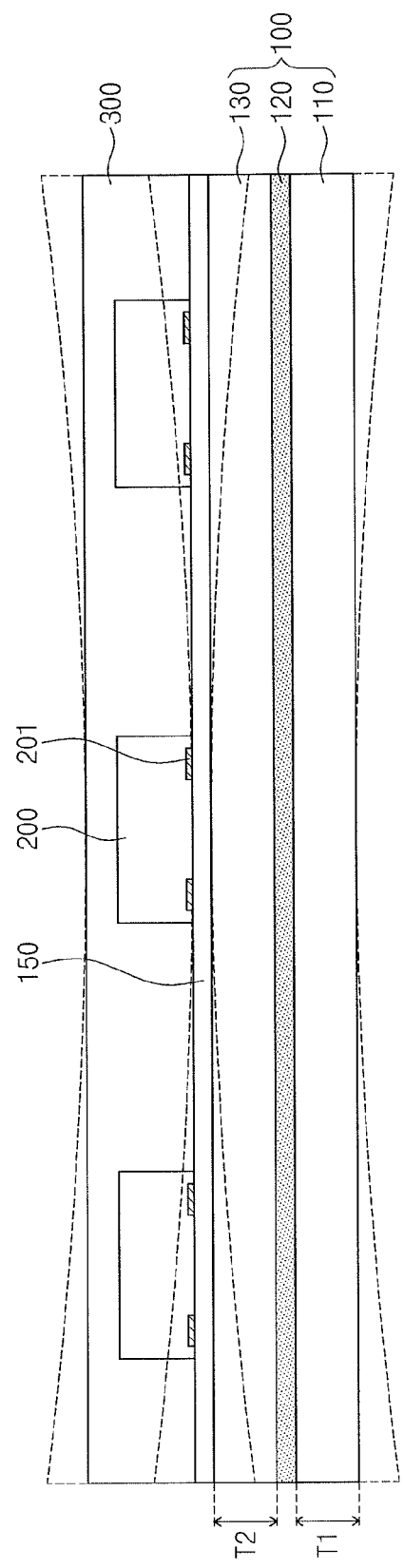
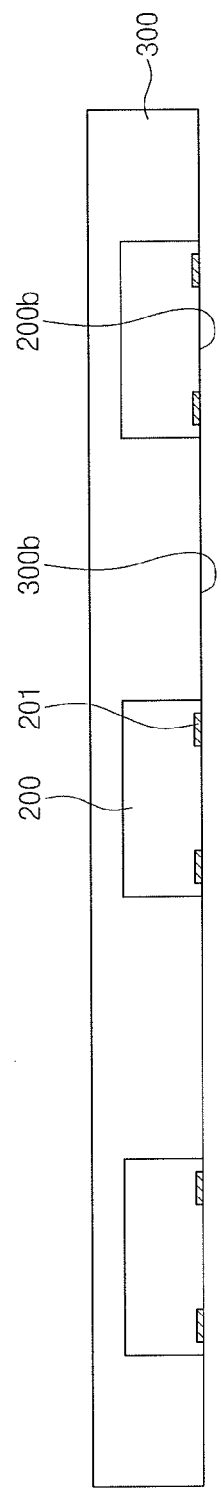

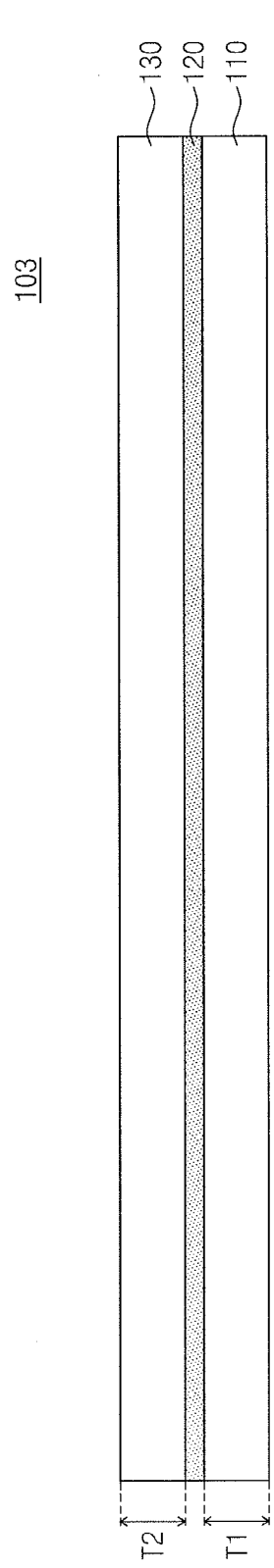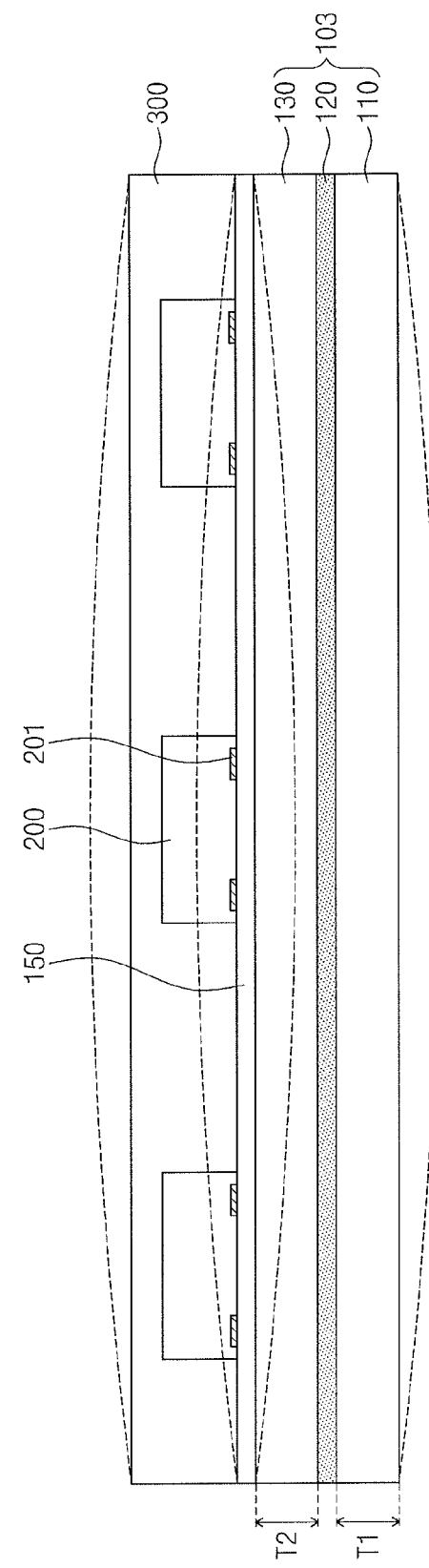
FIG. 5A
FIG. 5B

SUPPORT SUBSTRATE AND A METHOD OF MANUFACTURING A SEMICONDUCTOR PACKAGE USING THE SAME

CROSS-REFERENCE TO RELATED APPLICATION

Korean Patent Application No. 10-2016-0019771, filed on Feb. 19, 2016, in the Korean Intellectual Property Office, and entitled: "Support Substrate and A Method of Manufacturing A Semiconductor Package Using the Same," is incorporated by reference herein in its entirety.

BACKGROUND

1. Field

Embodiments relate to a support substrate and a method of manufacturing a semiconductor package using the same.

2. Description of the Related Art

In some semiconductor packaging techniques, a semiconductor chip may be mounted on a substrate by a flip-chip bonding method. Input/output (I/O) terminals may be arranged on an entire portion of a surface, adjacent to a substrate, of the semiconductor chip mounted on the substrate by the flip-chip bonding method, and thus the flip-chip bonding method may be applied to electronic devices (e.g., a microprocessor and/or a central processing unit (CPU)) needing a lot of I/O terminals.

SUMMARY

Embodiments are directed to a support substrate and a method of manufacturing a semiconductor package using the same.

The embodiments may be realized by providing a support substrate including a first plate; a second plate on the first plate; and an adhesive layer between the first plate and the second plate, wherein a coefficient of thermal expansion (CTE) of the adhesive layer is higher than a CTE of the first plate and higher than a CTE of the second plate.

The embodiments may be realized by providing a support substrate including a first inorganic layer; a polymer layer on the first inorganic layer; and a second inorganic layer on the polymer layer, wherein a coefficient of thermal expansion (CTE) of the polymer layer is higher than a CTE of the first inorganic layer and higher than a CTE of the second inorganic layer.

The embodiments may be realized by providing a method of manufacturing a semiconductor package, the method including providing a support substrate such that the support substrate includes a first plate, an adhesive layer, and a second plate which are sequentially stacked; disposing a semiconductor chip on the support substrate; forming a molding layer covering the semiconductor chip on the support substrate; and removing the support substrate to expose a bottom surface of the semiconductor chip, wherein a coefficient of thermal expansion (CTE) of the adhesive layer is higher than a CTE of the first plate and higher a CTE of the second plate.

The embodiments may be realized by providing a method of manufacturing a semiconductor package, the method including providing a support substrate such that the support substrate includes a first inorganic layer, a polymer layer on the first inorganic layer, and a second inorganic layer on the polymer layer; disposing a semiconductor chip on the support substrate; forming a molding layer covering the semiconductor chip on the support substrate; and removing the support substrate to expose a bottom surface of the semiconductor chip, wherein a coefficient of thermal expansion (CTE) of the polymer layer is higher than a CTE of the first inorganic layer and higher than a CTE of the second inorganic layer.

BRIEF DESCRIPTION OF THE DRAWINGS

Features will be apparent to those of skill in the art by describing in detail exemplary embodiments with reference to the attached drawings in which:

FIGS. 2A to 2E illustrate cross-sectional views of stages in a method of manufacturing a semiconductor package, according to some embodiments.

FIG. 5A illustrates a cross-sectional view of a support substrate according to some embodiments.

FIG. 5B illustrates a cross-sectional view of a process of hardening a molding layer in a method of manufacturing a semiconductor package using the support substrate of FIG. 5A.

DETAILED DESCRIPTION

Figure 1:
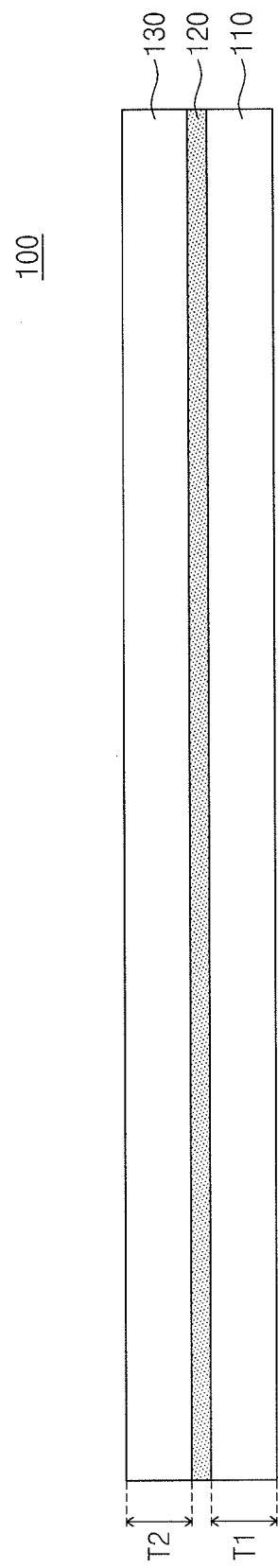
FIG. 1 illustrates a cross-sectional view of a support substrate according to some embodiments.

FIG. 1 illustrates a cross-sectional view of a support substrate according to some embodiments.

Referring to FIG. 1, a support substrate 100 may include a first plate 110, an adhesive layer 120, and a second plate 130. In an implementation, the first plate 110 may have a coefficient of thermal expansion (CTE) which ranges from, e.g., about 3 ppm/° C. to about 8.7 ppm/° C. The first plate 110 may include an inorganic material, e.g., single-crystalline silicon or glass (e.g., quartz). When the first plate 110 includes glass, the first plate 110 may further include a first alkali metal oxide. An alkali metal may refer to a group I element or a group II element. For example, the first alkali metal oxide may include at least one of sodium oxide (NaO), magnesium oxide (MgO), or calcium oxide (CaO). A kind or a composition ratio of the first alkali metal oxide may be controlled or selected to adjust the CTE of the first plate 110.

The adhesive layer 120 may be disposed on the first plate 110. A CTE of the adhesive layer 120 may be higher than the CTE of the first plate 110. In an implementation, the CTE of the adhesive layer 120 may range from, e.g., about 9 ppm/° C. to about 30 ppm/° C. The CTE of the adhesive layer 120 may refer to a CTE (α1) at a temperature equal to or lower than a glass transition temperature (Tg). In an implementation, the adhesive layer 120 may include a polymer. For example, the adhesive layer 120 may include at least one of polyethylene terephthalate, polybutylene terephthalate, polyethylene naphthalate, polyimide, polyamide, polyamide imide, polyacetal, polycarbonate, polyethersulfone, polyphenylene sulfide, polyphenylene ether, polyether ketone, polyarylate, polyether amide, or polyether imide.

The second plate 130 may be disposed on the adhesive layer 120. The second plate 130 may be bonded to the first plate 110 by the adhesive layer 120. A CTE of the second plate 130 may be lower than the CTE of the adhesive layer 120 and the CTE of the first plate 110. In an implementation, the CTE of the second plate 130 may range from, e.g., about 3 ppm/° C. to about 8.7 ppm/° C. The second plate 130 may include an insulating material. In an implementation, the second plate 130 may include single-crystalline silicon. In an implementation, the second plate 130 may include glass. When the second plate 130 includes glass, the second plate 130 may further include a second alkali metal oxide. The second alkali metal oxide may refer to an oxide of a group I element or an oxide of a group II element. Kinds and composition ratios of elements included in the second plate 130 may be controlled or selected such that the CTE of the second plate 130 is lower than the CTE of the first plate 110. In an implementation, at least one of the elements included in the second plate 130 may be different from elements included in the first plate 110. In an implementation, the elements included in the second plate 130 may be the same as the elements included in the first plate 110 but a composition ratio of the elements of the second plate 130 may be different from that of the elements of the first plate 110. In an implementation, a thickness T2 of the second plate 130 may be substantially equal to a thickness T1 of the first plate 110. In the present specification, the description of the thicknesses of components being substantially equal to each other may also include that a difference between the thicknesses of the components is in a process tolerance.

FIGS. 2A to 2E illustrate cross-sectional views of stages in a method of manufacturing a semiconductor package, according to some embodiments. Hereinafter, the descriptions to some components as mentioned above may be omitted or mentioned briefly for the purpose of ease and convenience in explanation.

Figure 2A:
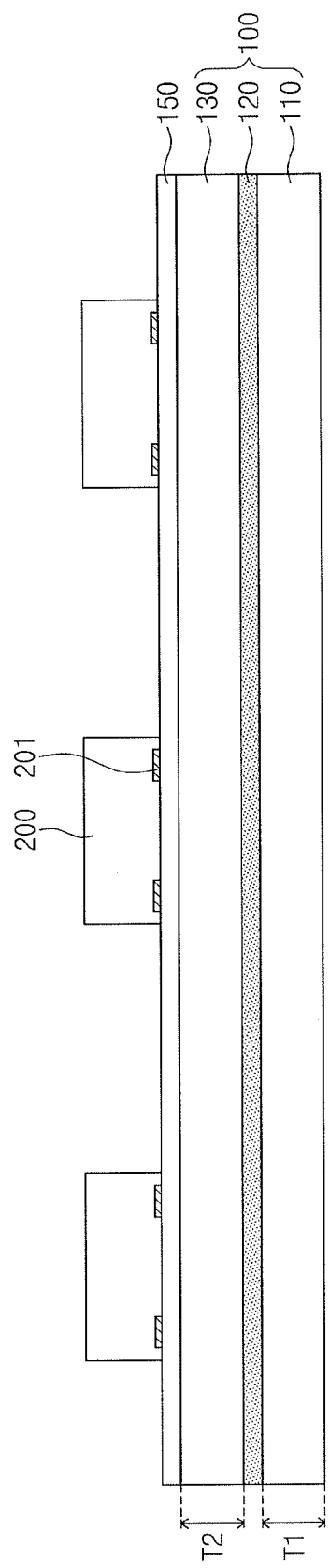

Referring to FIG. 2A, a support substrate 100 including a first plate 110, an adhesive layer 120, and a second plate 130 may be prepared. The support substrate 100 may be the same as described with reference to FIG. 1. An adhesive pattern 150 may be provided on the second plate 130. The adhesive pattern 150 may include a polymer. Semiconductor chips 200 may be disposed on the support substrate 100. The semiconductor chips 200 may be laterally spaced apart from each other. The semiconductor chips 200 may be bonded to the second plate 130 by the adhesive pattern 150. Chip pads 201 of the semiconductor chips 200 may face the support substrate 100. The semiconductor chips 200 may include silicon.

Referring to FIG. 2B, a molding layer 300 may be formed on the support substrate 100 to cover the semiconductor chips 200. For example, a molding material may be provided onto the support substrate 100 to cover the semiconductor chips 200. The molding material may include an epoxy molding compound (EMC). The molding material may be hardened to form the molding layer 300. Hereinafter, the hardening and the CTE of the molding layer 300 mean the hardening and the CTE of the molding material. The CTE of the molding layer 300 may be higher than the CTEs of the semiconductor chips 200. The molding layer 300 may be provided into a chamber at a temperature of, e.g., 150° C. to 200° C., and then the molding layer 300 may be cooled to room or ambient temperature (e.g., about 25° C.). Thus, the molding layer 300 may be hardened. In the process of hardening the molding layer 300, stress may be applied to the molding layer 300 due to a CTE mismatch between the molding layer 300 and the semiconductor chips 200. For example, the stress may be applied to the molding layer 300 in the process of cooling the molding layer 300 from the temperature of 150° C. to 200° C. to the ambient temperature (e.g., about 25° C.). If the support substrate 100 were to be omitted, the molding layer 300 could be warped to have a concave shape illustrated by a dotted line of FIG. 2B. For example, the warpage of the molding layer 300 could occur such that edge portions of the molding layer 300 are higher than a central portion of the molding layer 300. In the present specification, the stress/warpage occurring due to the CTE mismatch in the process of hardening the molding layer 300 may mean the stress/warpage occurring in the cooling process of the process of hardening the molding layer 300. The CTE of the first plate 110 and the CTE of the adhesive layer 120 may be higher than the CTE of the second plate 130, as described above. In the process of hardening the molding layer 300, stress may be applied to the support substrate 100 due to the CTE mismatch between the first plate 110 and the second plate 130 and the CTE mismatch between the adhesive layer 120 and the second plate 130. The stress of the support substrate 100 may induce anti-warpage with respect to the molding layer 300. In the present specification, the term "anti-warpage" refers to imaginary warpage that may occur at the support substrate 100 if warpage of the molding layer 300 does not exist or occur in the process of hardening the molding layer 300, e.g., an effect that effectively counteracts potential warpage of the molding layer 300. For example, anti-warpage may not be observed or shown in processes of manufacturing a semiconductor package. If the warpage of the molding layer 300 does not exist or occur, the support substrate 100 may have a convex shape by the anti-warpage, like a dotted line of FIG. 2B. For example, the anti-warpage of the support substrate 100 may be a force that may be applied such that edge portions of the support substrate 100 are lower than a central portion of the support substrate 100 if the warpage of the molding layer 300 does not exist or occur. A direction in which the anti-warpage of the support substrate 100 is applied may be opposite to a direction in which the warpage of the molding layer 300 is applied. An intensity of the anti-warpage of the support substrate 100 may be substantially equal to that of the warpage of the molding layer 300. The CTE of the first plate 110, the CTE of the adhesive layer 120, and/or the CTE of the second plate 130 may be adjusted to adjust the intensity of the anti-warpage of the support substrate 100. The CTEs of the first and second plates 110 and 130 may be adjusted by controlling kinds and/or composition ratios of the elements included in the first and second plates 110 and 130. The warpage of the molding layer 300 may be offset or counteracted by the anti-warpage of the support substrate 100 in the process of hardening the molding layer 300. Thus, the molding layer 300 may be and/or remain substantially flat after the hardening process. For example, a difference the maximum height and the minimum height from a bottom surface of the molding layer 300 may be smaller than 50 µm. If the first plate 110 and the adhesive layer 120 were to be omitted, the anti-warpage of the support substrate 100 could be insufficient for offsetting or counteracting the warpage of the molding layer 300.

Referring to FIG. 2C, the support substrate 100 of FIG. 2B and the adhesive pattern 150 of FIG. 2B may be removed to expose bottom surfaces 200b of the semiconductor chips 200 and a bottom surface 300b of the molding layer 300.

Figure 2D:
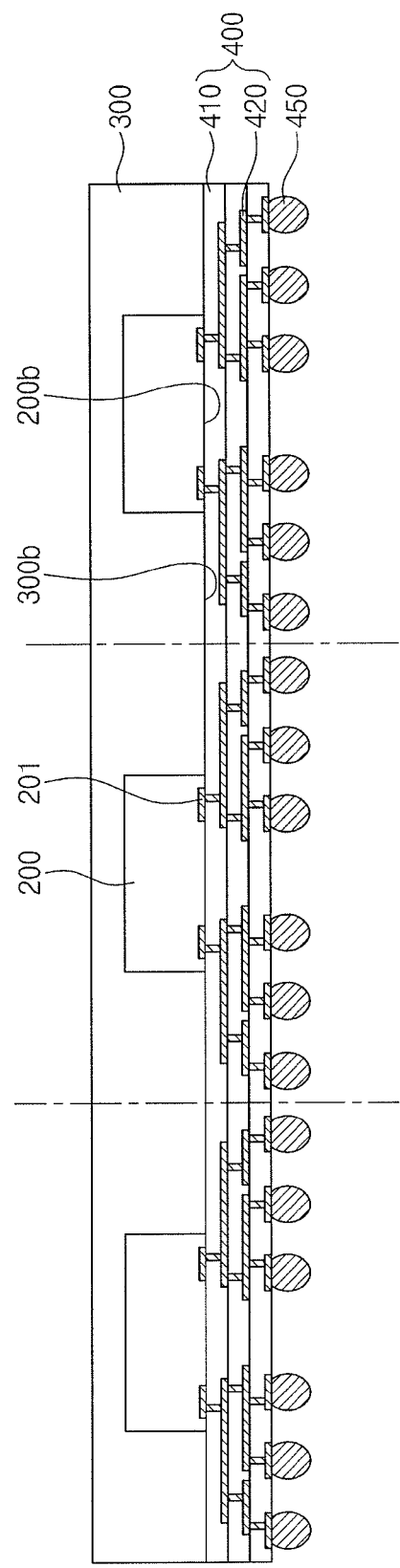
Figure 2E:
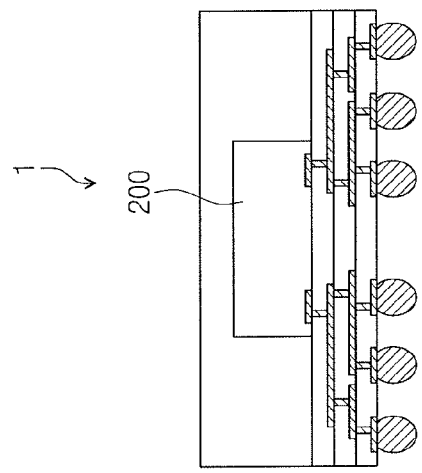
Figure 2E:
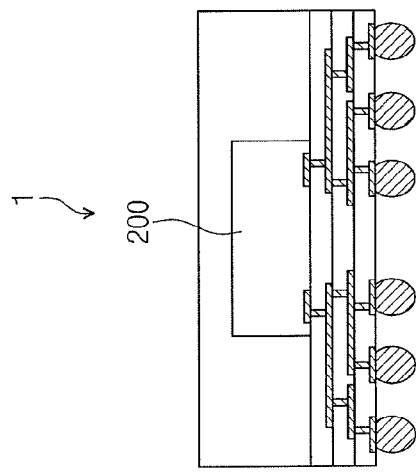
Figure 2E:
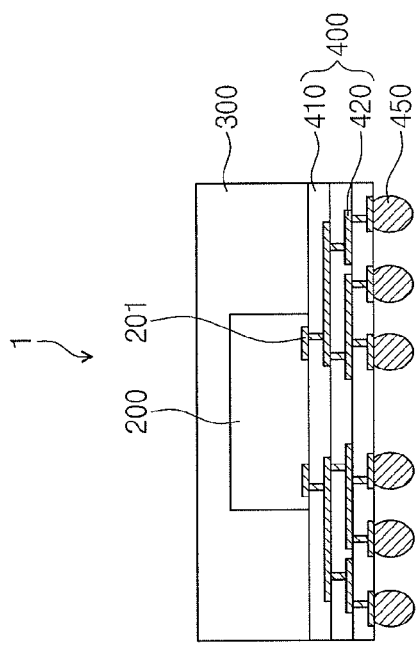

Referring to FIGS. 2D and 2E, a substrate 400 may be formed on the bottom surfaces 200b of the semiconductor chips 200 and the bottom surface 300b of the molding layer 300. The substrate 400 may include insulating patterns 410 and conductive patterns 420. The conductive patterns 420 may be provided between the insulating patterns 410 and may be electrically connected to the chip pads 201 of the semiconductor chips 200. It will be understood that when an element is referred to as being "connected" or "coupled" to another element, it may be directly connected or coupled to the other element or intervening elements may be present. External terminals 450 may be formed on a bottom surface of the substrate 400 and may be electrically connected to the conductive patterns 420. In an implementation, the external terminals 450 may have solder ball shapes. The substrate 400 may be sawed along alternated long and short dash lines illustrated in FIG. 2D, thereby separating semiconductor packages 1 of FIG. 2E from each other. If warpage of the molding layer 300 were to occur, semiconductor chips 200 disposed at positions at which the warpage occurs could be damaged. The damaged semiconductor chips 200 may be scrapped after the sawing process. However, according to the embodiments, the warpage of the molding layer 300 may be minimized or prevented to help improve a yield of the semiconductor packages 1.

Figure 3A:
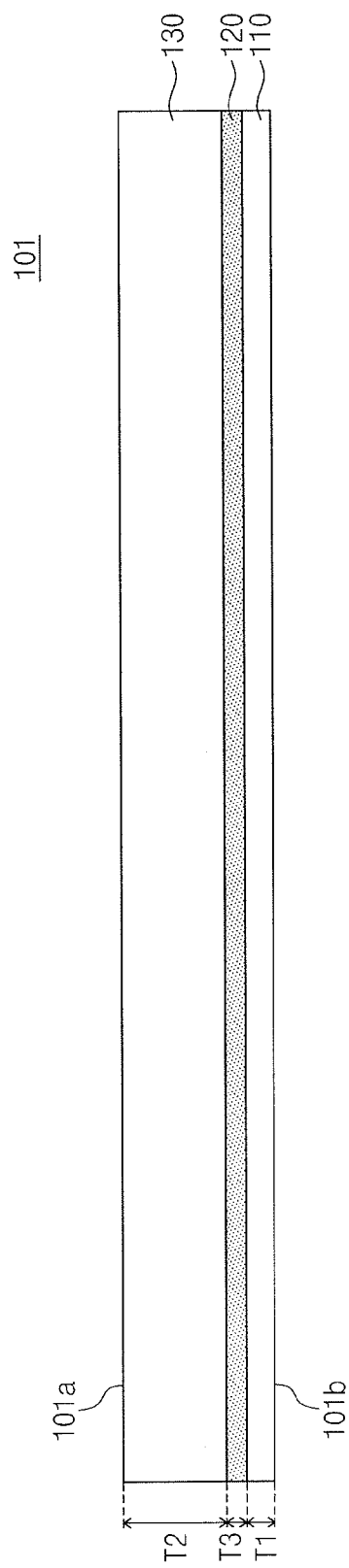
FIG. 3A illustrates a cross-sectional view of a support substrate according to some embodiments.

FIG. 3A illustrates a cross-sectional view of a support substrate according to some embodiments. Hereinafter, the descriptions to the same components as mentioned above may be omitted or mentioned briefly for the purpose of ease and convenience in explanation.

Referring to FIG. 3A, a support substrate 101 may include a first plate 110, an adhesive layer 120, and a second plate 130 which are sequentially stacked. The support substrate 101 may have a top surface 101a and a bottom surface 101b. The top surface 101a of the support substrate 101 may be adjacent to or on the second plate 130, and the bottom surface 101b may be opposite to the top surface 101a. The first plate 110, the adhesive layer 120, and the second plate 130 may include the same materials as described with reference to FIG. 1.

A coefficient of thermal expansion (CTE) of the first plate 110 may be equal to or higher than that of the second plate 130. When the CTE of the first plate 110 is equal to that of the second plate 130, the first plate 110 may include the same element(s) as the second plate 130 and may have the same element composition ratio as the second plate 130 (e.g., the first and second plates may include or be formed of the same material). When the CTE of the first plate 110 is higher than that of the second plate 130, the first plate 110 may include a different element(s) from the second plate 130 and/or may have a different element composition ratio from the second plate 130 (e.g., the first and second plates may include or be formed of a different material). A thickness T1 of the first plate 110 may be smaller than a thickness T2 of the second plate 130.

A CTE of the adhesive layer 120 may be higher than CTEs of the first and second plates 110 and 130. A distance between the adhesive layer 120 and the top surface 101a of the support substrate 101 may be greater than a distance between the adhesive layer 120 and the bottom surface 101b of the support substrate 101. In an implementation, a sum of the thickness T1 of the first plate 110, a thickness T3 of the adhesive layer 120, and the thickness T2 of the second plate 130 may range from, e.g., about 0.7 mm to about 1.5 mm.

Figure 3B:
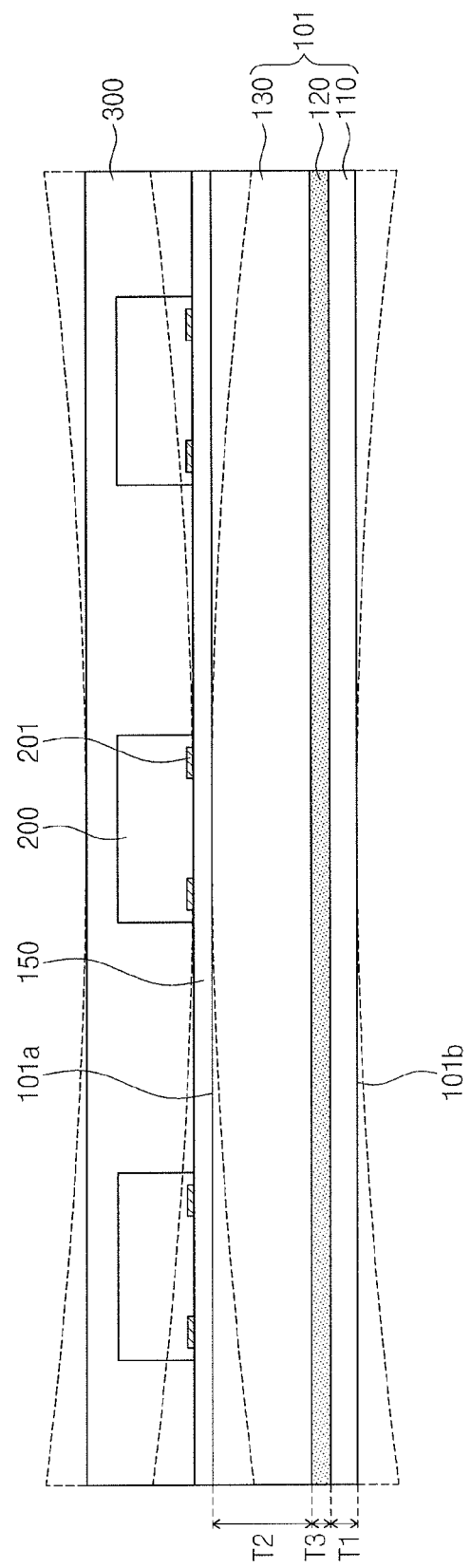
FIG. 3B illustrates a cross-sectional view of a process of hardening a molding layer in a method of manufacturing a semiconductor package using the support substrate of FIG. 3A.

FIG. 3B illustrates a cross-sectional view of a process of hardening a molding layer in a method of manufacturing a semiconductor package using the support substrate of FIG. 3A.

Referring to FIG. 3B, semiconductor chips 200 and a molding layer 300 may be formed on the support substrate 101. Here, the support substrate 101 may be the same as described with reference to FIG. 3A. A CTE of the molding layer 300 may be higher than CTEs of the semiconductor chips 200. Warpage of a concave shape illustrated by a dotted line of FIG. 3B could be applied to or occur in the molding layer 300 in a process of hardening the molding layer 300.

The CTE of the adhesive layer 120 may be higher than CTEs of the first and second plates 110 and 130. The distance between the adhesive layer 120 and the top surface 101a of the support substrate 101 may be greater than the distance between the adhesive layer 120 and the bottom surface 101b of the support substrate 101. An average CTE of a lower portion of the support substrate 101 may be higher than an average CTE of an upper portion of the support substrate 101. Here, the upper portion of the support substrate 101 may be disposed on a center line defined between the top surface 101a and the bottom surface 101b of the support substrate 101, and the lower portion of the support substrate 101 may be disposed under the center line. The center line may be parallel to the top and bottom surfaces 101a and 101b, and a distance between the top surface 101a and the center line may be equal to a distance between the bottom surface 101b and the center line. Anti-warpage of a convex shape illustrated by a dotted line of FIG. 3B may be applied to the support substrate 101 due to the CTE mismatch between the lower portion and the upper portion of the support substrate 101. A direction of the anti-warpage of the support substrate 101 may be opposite to a direction of the warpage of the molding layer 300, and an intensity of the anti-warpage of the support substrate 101 may be substantially equal to that of the warpage of the molding layer 300. The CTEs and/or the thicknesses T1 to T3 of the first plate 110, the adhesive layer 120, and the second plate 130 may be adjusted or selected to adjust the intensity of the anti-warpage of the support substrate 101. The warpage of the molding layer 300 may be offset or counteracted by the anti-warpage of the support substrate 101, and thus the molding layer 300 may be or may remain substantially flat.

Referring again to FIGS. 2C to 2E, the support substrate 101 may be removed to expose the bottom surfaces 200b of the semiconductor chips 200 and the bottom surface 300b of the molding layer 300. The substrate 400 may be formed on the bottom surfaces 200b of the semiconductor chips 200 and the bottom surface 300b of the molding layer 300. The sawing process may be performed on the substrate 400 to manufacture the semiconductor packages 1.

Figure 4A:
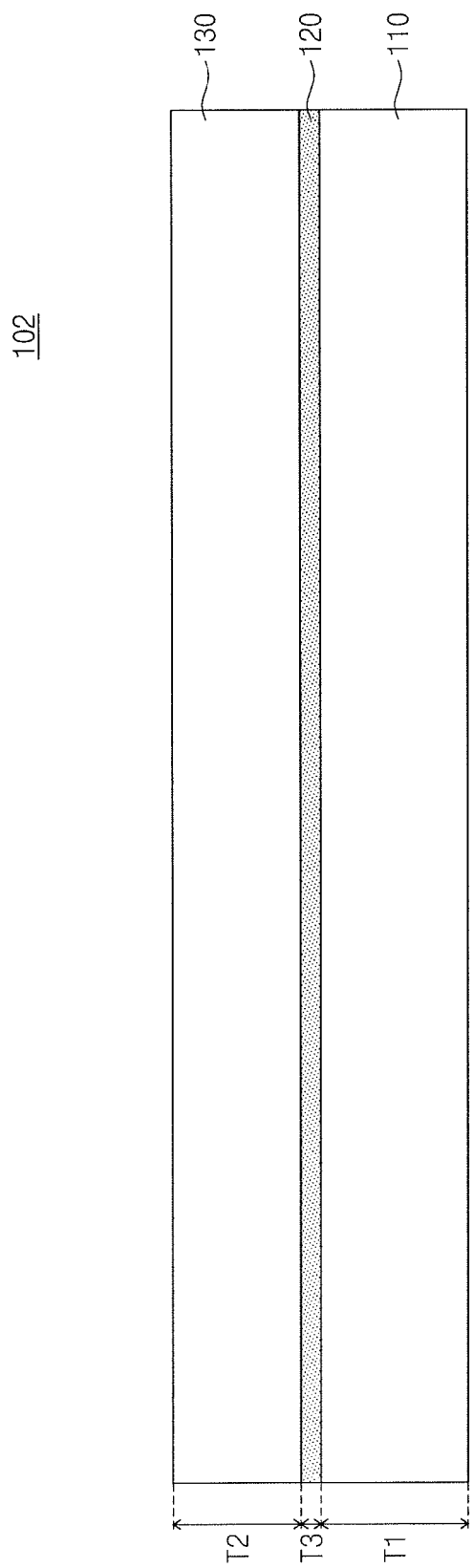
FIG. 4A illustrates a cross-sectional view of a support substrate according to some embodiments.

FIG. 4A illustrates a cross-sectional view of a support substrate according to some embodiments. Hereinafter, the descriptions to the same components as mentioned above may be omitted or mentioned briefly for the purpose of ease and convenience in explanation.

Referring to FIG. 4A, a support substrate 102 may include a first plate 110, an adhesive layer 120, and a second plate 130 which are sequentially stacked. A coefficient of thermal expansion (CTE) of the first plate 110 may be higher than that of the second plate 130. A thickness T1 of the first plate 110 may be greater than a thickness T2 of the second plate 130.

A thickness T3 of the adhesive layer 120 may be much smaller than the thickness T1 of the first plate 110 and the thickness T2 of the second plate 130. A CTE of the adhesive layer 120 may be higher than the CTE of the first plate 110. However, a difference between the CTEs of the adhesive layer 120 and the first plate 110 of the present embodiment may be smaller than a difference between the CTEs of the adhesive layer 120 and the first plate 110 of the embodiment illustrated in FIG. 3A. Thus, an average CTE of a lower portion of the support substrate 102 may be higher than an average CTE of an upper portion of the support substrate 102. In an implementation, a sum of the thickness T1 of the first plate 110, the thickness T3 of the adhesive layer 120, and the thickness T2 of the second plate 130 may be, e.g., greater than 1.5 mm. The first plate 110, the adhesive layer 120, and the second plate 130 may include the same materials as described with reference to FIG. 1.

Figure 4B:
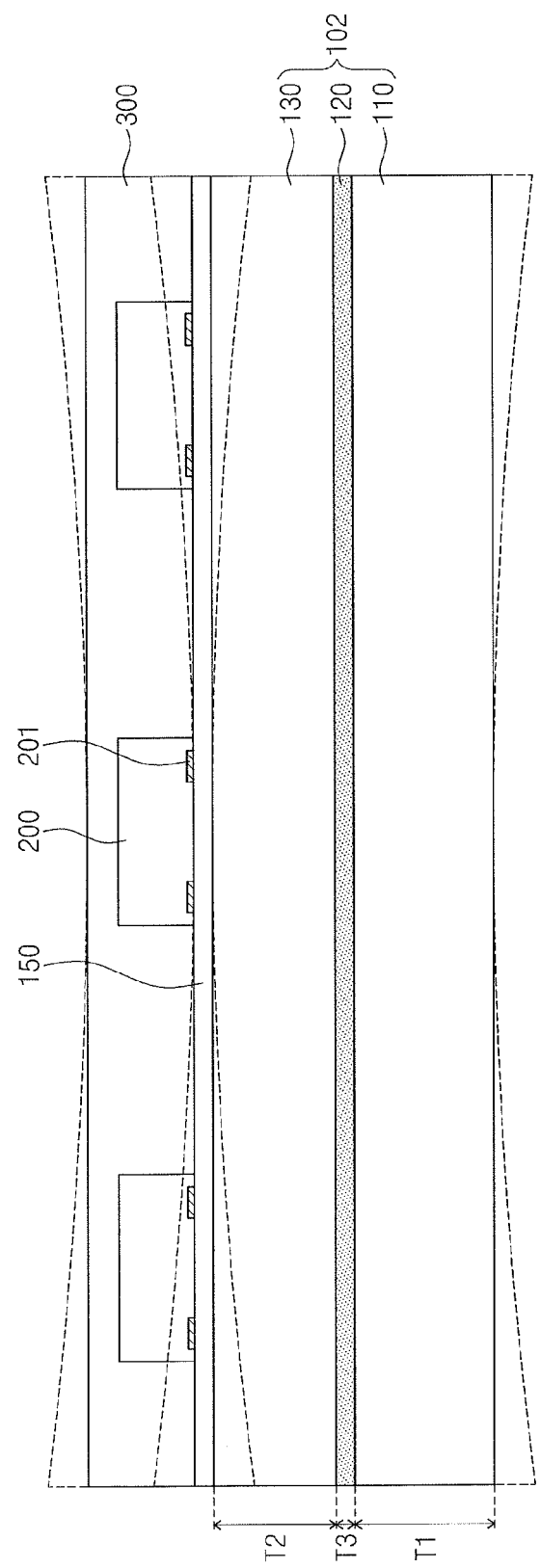
FIG. 4B illustrates a cross-sectional view of a process of hardening a molding layer in a method of manufacturing a semiconductor package using the support substrate of FIG. 4A.

FIG. 4B illustrates a cross-sectional view of a process of hardening a molding layer in a method of manufacturing a semiconductor package using the support substrate of FIG. 4A.

Referring to FIG. 4B, semiconductor chips 200 and a molding layer 300 may be formed on the support substrate 102. The support substrate 102 may be the same as described with reference to FIG. 4A. A CTE of the molding layer 300 may be higher than CTEs of the semiconductor chips 200. Warpage of a concave shape illustrated by a dotted line of FIG. 4B could be applied to or occur in the molding layer 300 in a process of hardening the molding layer 300.

In the process of hardening the molding layer 300, anti-warpage may be induced to or may result from the support substrate 102 due to the CTE mismatch among the first plate 110, the adhesive layer 120, and the second plate 130. At least one of the CTEs or the thicknesses T1 to T3 of the first plate 110, the adhesive layer 120, and the second plate 130 may be adjusted or selected to adjust the direction and the intensity of the anti-warpage of the support substrate 102. The average CTE of the lower portion of the support substrate 102 may be higher than the average CTE of the upper portion of the support substrate 102. The anti-warpage may be induced to or occur in the support substrate 102 in a convex shape illustrated by a dotted line of FIG. 4B. The warpage of the molding layer 300 may be offset or counteracted by the anti-warpage of the support substrate 102, and thus the warpage of the molding layer 300 may be reduced or prevented.

FIG. 5A illustrates a cross-sectional view of a support substrate according to some embodiments. Hereinafter, the descriptions to the same components as mentioned above may be omitted or mentioned briefly for the purpose of ease and convenience in explanation.

Referring to FIG. 5A, a support substrate 103 may include a first plate 110, an adhesive layer 120, and a second plate 130 which are sequentially stacked. A coefficient of thermal expansion (CTE) of the second plate 130 may be higher than that of the first plate 110. In an implementation, a kind of at least one element of an inorganic material of the second plate 130 may be different from a kind of elements of an inorganic material of the first plate 110. In an implementation, a composition ratio of the inorganic material of the second plate 130 may be different from that of the inorganic material of the first plate 110. A thickness T2 of the second plate 130 may be substantially equal to a thickness T1 of the first plate 110. A CTE of the adhesive layer 120 may be higher than CTEs of the first and second plates 110 and 130. The adhesive layer 120 may include a polymer.

FIG. 5B illustrates a cross-sectional view of a process of hardening a molding layer in a method of manufacturing a semiconductor package using the support substrate of FIG. 5A.

Referring to FIG. 5B, semiconductor chips 200 and a molding layer 300 may be formed on the support substrate 103 described with reference to FIG. 5A. In a process of hardening the molding layer 300, warpage of a convex shape illustrated by a dotted line of FIG. 5B could be applied to or occur in the molding layer 300 due to CTE mismatch between the molding layer 300 and the semiconductor chips 200.

The CTEs of the adhesive layer 120 and the second plate 130 may be higher than that of the first plate 110. In the process of hardening the molding layer 300, anti-warpage of a concave shape (illustrated by a dotted line of FIG. 5B) may be induced to or occur in the support substrate 103 due to the CTE mismatch among the first plate 110, the adhesive layer 120, and the second plate 130. A direction of the anti-warpage of the support substrate 103 may be opposite to a direction of the warpage of the molding layer 300, and an intensity of the anti-warpage of the support substrate 103 may be substantially equal to that of the warpage of the molding layer 300. The warpage of the molding layer 300 may be offset or counteracted by the anti-warpage of the support substrate 103, and thus the molding layer 300 may be or may remain substantially flat.

Figure 6A:
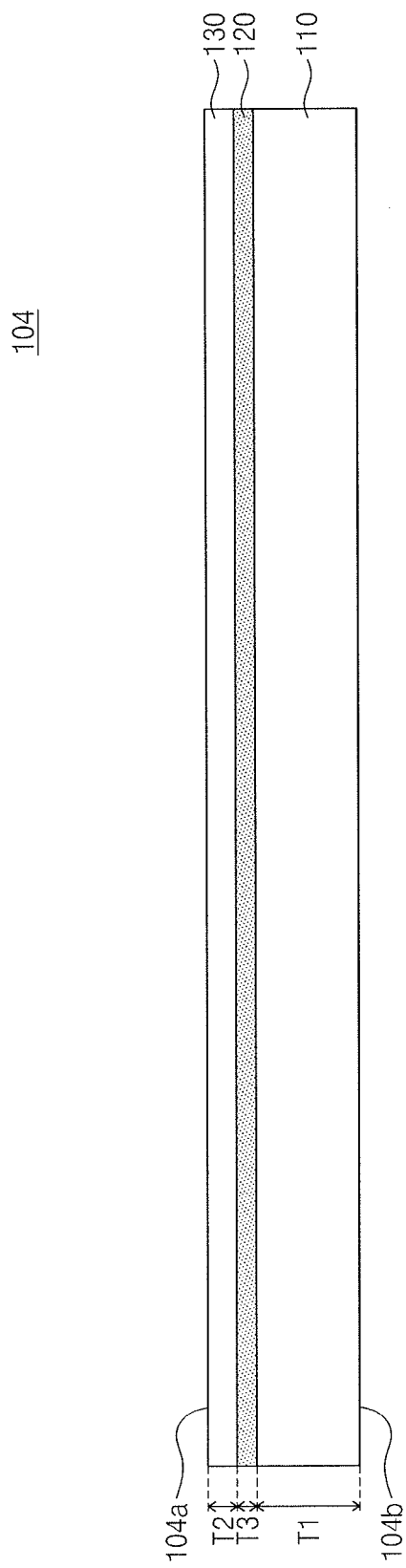
FIG. 6A illustrates a cross-sectional view of a support substrate according to some embodiments.

FIG. 6A illustrates a cross-sectional view of a support substrate according to some embodiments. Hereinafter, the descriptions to the same components as mentioned above may be omitted or mentioned briefly for the purpose of ease and convenience in explanation.

Referring to FIG. 6A, a support substrate 104 may include a first plate 110, an adhesive layer 120, and a second plate 130 which are sequentially stacked. The first plate 110, the adhesive layer 120, and the second plate 130 may include the same materials as described with reference to FIG. 1. However, composition ratios of the first and second plates 110 and 130 according to the present embodiment may be different from those of the first and second plates 110 and 130 according to the embodiment of FIG. 1.

A coefficient of thermal expansion (CTE) of the second plate 130 may be equal to or higher than that of the first plate 110. A CTE of the adhesive layer 120 may be higher than CTEs of the first and second plates 110 and 130.

A thickness T2 of the second plate 130 may be smaller than a thickness T1 of the first plate 110. A sum of the thickness T1 of the first plate 110, the thickness T3 of the adhesive layer 120, and the thickness T2 of the second plate 130 may range from, e.g., about 0.7 mm to about 1.5 mm. A distance between the adhesive layer 120 and a top surface 104a of the support substrate 104 may be smaller than a distance between the adhesive layer 120 and a bottom surface 104b of the support substrate 104.

Figure 6B:
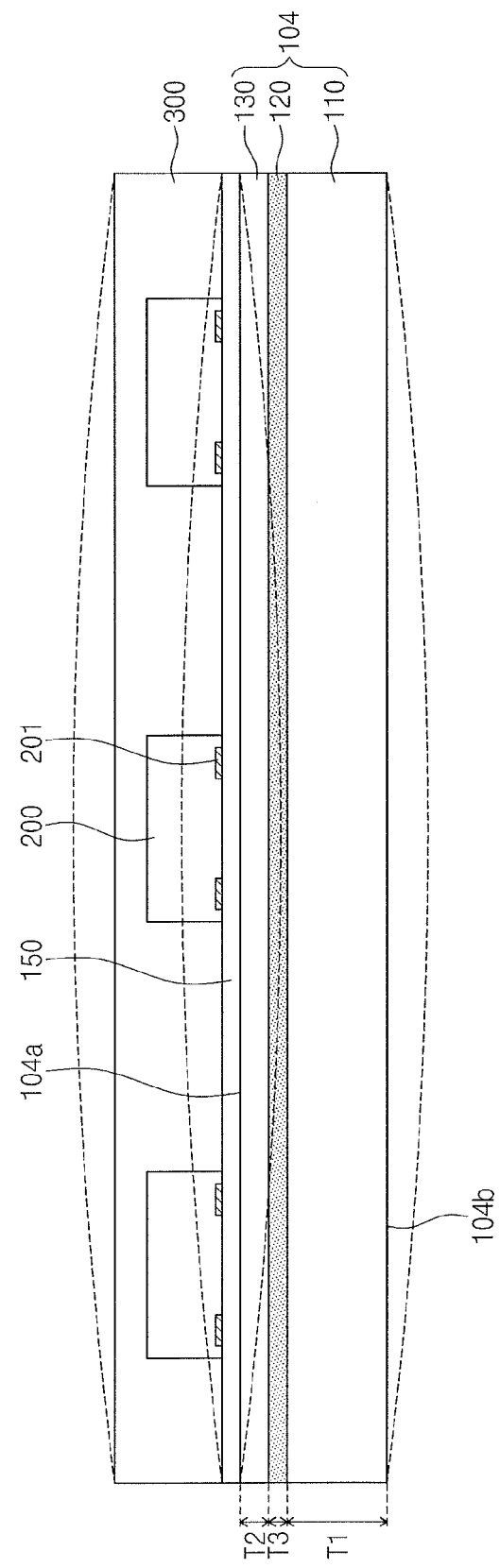
FIG. 6B illustrates a cross-sectional view of a process of hardening a molding layer in a method of manufacturing a semiconductor package using the support substrate of FIG. 6A.

FIG. 6B illustrates a cross-sectional view of a process of hardening a molding layer in a method of manufacturing a semiconductor package using the support substrate of FIG. 6A.

Referring to FIG. 6B, semiconductor chips 200 and a molding layer 300 may be formed on the support substrate 104. The support substrate 104 may be the same as described with reference to FIG. 6A. Warpage of a convex shape illustrated by a dotted line of FIG. 6B could be applied to or occur in the molding layer 300 in a process of hardening the molding layer 300.

In the process of hardening the molding layer 300, anti-warpage may be induced to or occur in the support substrate 104 due to CTE mismatch among the first plate 110, the adhesive layer 120, and the second plate 130. For example, the adhesive layer 120 may greatly affect a direction of the anti-warpage of the support substrate 104. A CTE of the adhesive layer 120 may be higher than CTEs of the first and second plates 110 and 130. A distance between the adhesive layer 120 and the top surface 104a of the support substrate 104 may be smaller than a distance between the adhesive layer 120 and the bottom surface 104b of the support substrate 104. Thus, an average CTE of a lower portion of the support substrate 104 may be lower than an average CTE of an upper portion of the support substrate 104. The anti-warpage of the support substrate 104 may be induced or occur in a concave shape illustrated by a dotted line of FIG. 6B. The warpage of the molding layer 300 may be offset or counteracted by the anti-warpage of the support substrate 104, and thus the warpage of the molding layer 300 may be reduced or prevented.

Figure 7A:
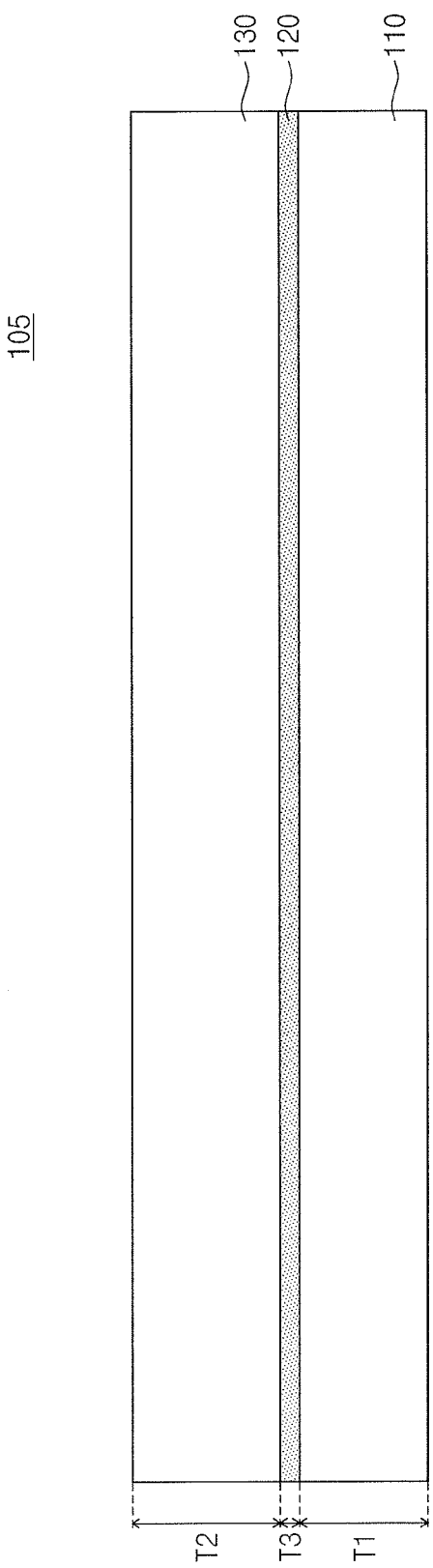
FIG. 7A illustrates a cross-sectional view of a support substrate according to some embodiments.

FIG. 7A illustrates a cross-sectional view of a support substrate according to some embodiments. Hereinafter, the descriptions to the same components as mentioned above will be omitted or mentioned briefly for the purpose of ease and convenience in explanation.

Referring to FIG. 7A, a support substrate 105 may include a first plate 110, an adhesive layer 120, and a second plate 130 which are sequentially stacked. The first plate 110, the adhesive layer 120, and the second plate 130 may include the same materials as described with reference to FIG. 1. However, composition ratios of the first and second plates 110 and 130 according to the present embodiment may be different from those of the first and second plates 110 and 130 according to the embodiment of FIG. 1. A sum of a thickness T1 of the first plate 110, a thickness T3 of the adhesive layer 120, and a thickness T2 of the second plate 130 may be, e.g., greater than 1.5 mm.

The thickness T2 of the second plate 130 may be greater than the thickness T1 of the first plate 110. A coefficient of thermal expansion (CTE) of the second plate 130 may be higher than that of the first plate 110.

The thickness T3 of the adhesive layer 120 may be much smaller than the thickness T1 of the first plate 110 and the thickness T2 of the second plate 130. A CTE of the adhesive layer 120 may be higher than the CTE of the first plate 110. However, a difference between the CTEs of the adhesive layer 120 and the first plate 110 of the present embodiment may be smaller than a difference between the CTEs of the adhesive layer 120 and the first plate 110 of the embodiment illustrated in FIG. 6A. An average CTE of a lower portion of the support substrate 105 may be lower than an average CTE of an upper portion of the support substrate 105.

Figure 7B:
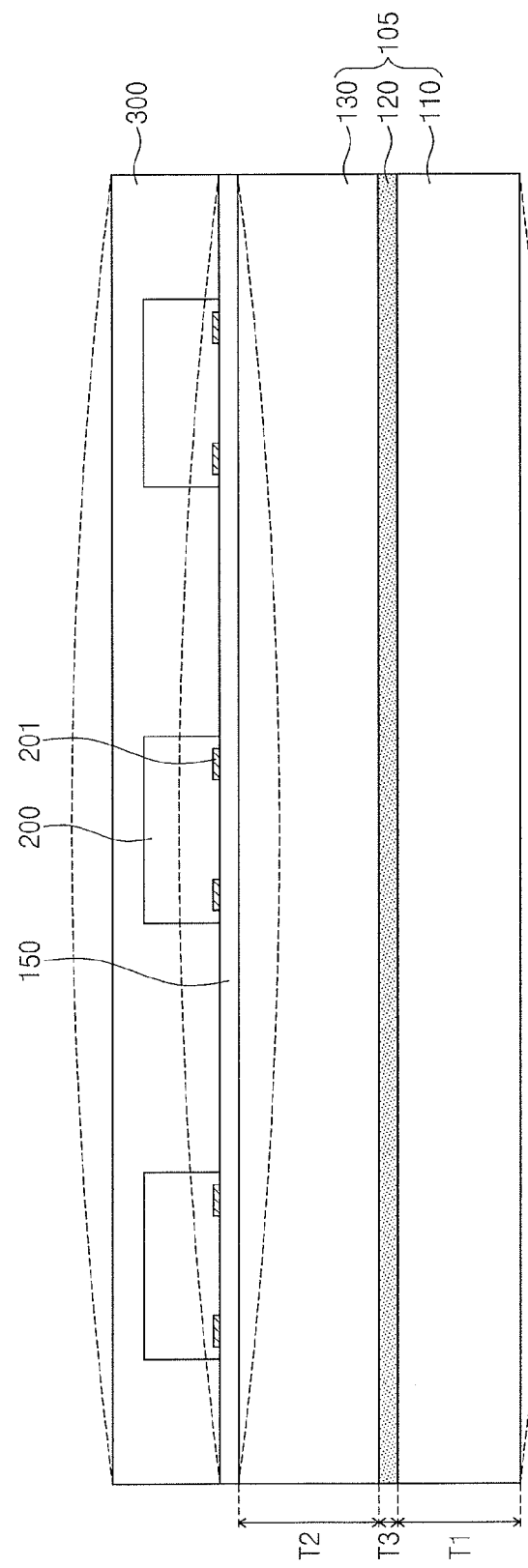
FIG. 7B illustrates a cross-sectional view illustrating a process of hardening a molding layer in a method of manufacturing a semiconductor package using the support substrate of FIG. 7A.

FIG. 7B illustrates a cross-sectional view of a process of hardening a molding layer in a method of manufacturing a semiconductor package using the support substrate of FIG. 7A.

Referring to FIG. 7B, semiconductor chips 200 and a molding layer 300 may be formed on the support substrate 105. Warpage of a convex shape illustrated by a dotted line of FIG. 7B could be applied to or occur in the molding layer 300 in a process of hardening the molding layer 300.

In the process of hardening the molding layer 300, anti-warpage may be induced to or occur in the support substrate 105 due to the CTE mismatch among the first plate 110, the adhesive layer 120, and the second plate 130. For example, an influence of the first plate 110 on a direction of the anti-warpage of the support substrate 105 may be greater than an influence of the adhesive layer 120 on the direction of the anti-warpage. An average CTE of a lower portion of the support substrate 105 may be lower than an average CTE of an upper portion of the support substrate 105. The anti-warpage of the support substrate 105 may be induced or occur in a concave shape illustrated by a dotted line of FIG. 7B. The warpage of the molding layer 300 may be offset or counteracted by the anti-warpage of the support substrate 105, and thus the warpage of the molding layer 300 may be reduced or prevented.

By way of summation and review, the flip-chip bonding method may help reduce electrical connection lengths between a semiconductor chip and external terminals of a semiconductor package, and thus the semiconductor package using the flip-chip bonding method may have excellent electrical and physical characteristics. Meanwhile, warpage of a semiconductor package may occur in processes of manufacturing a semiconductor package.

According to some embodiments, the support substrate may include the first plate, the adhesive layer, and the second plate which are sequentially stacked. The CTEs and/or the thicknesses of the first and second plates may be adjusted. The CTEs of the plates may be adjusted by controlling the kinds of the elements and/or the composition ratios of the plates. In the process of hardening the molding layer, the stress caused by the CTE mismatch between the molding layer and the semiconductor chip may be offset by the stress caused by the CTE mismatch among the first plate, the adhesive layer, and the second plate. Thus, the warpage of the molding layer may be reduced or prevented.

The embodiments may provide a support substrate capable of reducing or minimizing a warpage phenomenon.

The embodiments may provide a method of manufacturing a semiconductor package, which is capable of improving a yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:
   providing a support substrate such that the support substrate includes a first plate, an adhesive layer, and a second plate which are sequentially stacked;
   disposing a semiconductor chip on the support substrate;
   forming a molding layer covering the semiconductor chip on the support substrate; and
   removing the support substrate to expose a bottom surface of the semiconductor chip,
   wherein:
   a coefficient of thermal expansion (CTE) of the adhesive layer is higher than a CTE of the first plate and higher than a CTE of the second plate,
   the first plate includes the same inorganic elements as the second plate, and a composition ratio of the first plate is equal to a composition ratio of the second plate.

2. The method as claimed in claim 1, wherein the CTE of the first plate is higher than the CTE of the second plate.

3. The method as claimed in claim 2, wherein:
the support substrate has a top surface facing the semiconductor chip and a bottom surface opposite to the top surface, and
a distance between the adhesive layer and the bottom surface of the support substrate is smaller than a distance between the adhesive layer and the top surface of the support substrate.

4. The method as claimed in claim 1, wherein a thickness of the first plate is substantially equal to a thickness of the second plate.

5. The method as claimed in claim 1, further comprising forming a substrate on the bottom surface of the semiconductor chip after removing the support substrate,
wherein the substrate includes insulating patterns and a conductive pattern disposed between the insulating patterns.

6. The method as claimed in claim 1, wherein forming the molding layer includes:
providing a molding material onto the support substrate to cover the semiconductor chip; and
hardening the molding material.

7. A semiconductor package prepared according to the method of claim 1.

8. A semiconductor package prepared according to the method of claim 2.

9. A semiconductor package prepared according to the method of claim 3.

10. A semiconductor package prepared according to the method of claim 4.

11. A semiconductor package prepared according to the method of claim 5.

12. A semiconductor package prepared according to the method of claim 6.

13. A method of manufacturing a semiconductor package, the method comprising:
providing a support substrate such that the support substrate includes a first inorganic layer, a polymer layer on the first inorganic layer, and a second inorganic layer on the polymer layer;
disposing a semiconductor chip on the support substrate;
forming a molding layer covering the semiconductor chip on the support substrate; and
removing the support substrate to expose a bottom surface of the semiconductor chip,
wherein:
a coefficient of thermal expansion (CTE) of the polymer layer is higher than a CTE of the first inorganic layer and higher than a CTE of the second inorganic layer,
elements of the second inorganic layer are the same as elements of the first inorganic layer, and
a composition ratio of the elements of the second inorganic layer is different from a composition ratio of the elements of the first inorganic layer.

14. A semiconductor package prepared according to the method of claim 13.

15. The semiconductor package as claimed in claim 14, wherein the CTE of the first inorganic layer is higher than the CTE of the second inorganic layer.

16. The semiconductor package as claimed in claim 15, wherein a thickness of the first inorganic layer is different from a thickness of the second inorganic layer.

17. The semiconductor package as claimed in claim 14, wherein a thickness of the first inorganic layer is substantially equal to a thickness of the second inorganic layer.

18. The semiconductor package as claimed in claim 17, wherein at least one of elements forming the second inorganic layer is different from elements forming the first inorganic layer.

19. The semiconductor package as claimed in claim 16, wherein:
the first inorganic layer is thinner than the second inorganic layer.

* * * * *